(12) United States Patent
Butler et al.

(10) Patent No.: US 7,630,059 B2
(45) Date of Patent: Dec. 8, 2009

(54) LITHOGRAPHIC APPARATUS AND DEVICE MANUFACTURING METHOD

(75) Inventors: Hans Butler, Best (NL); Jan-Gerard Cornelis Van Der Toorn, Eindhoven (NL); Martijn Houkes, Sittard (NL); Wilhelmus Franciscus Johannes Simons, Beesel (NL)

(73) Assignee: ASML Netherlands B.V., Veldhoven (NL)

( * ) Notice: Subject to any disclaimer, the term of this patent is extended or adjusted under 35 U.S.C. 154(b) by 378 days.

(21) Appl. No.: 11/491,493

(22) Filed: Jul. 24, 2006

(65) Prior Publication Data

US 2008/0018877 A1    Jan. 24, 2008

(51) Int. Cl.
G03B 27/58    (2006.01)
H02N 3/00    (2006.01)

(52) U.S. Cl. .......................... 355/72; 310/10
(58) Field of Classification Search ................... 355/53, 355/72, 73, 74, 75, 76; 310/10, 12; 318/649
See application file for complete search history.

(56) References Cited

U.S. PATENT DOCUMENTS 6,504,162 B1 * 1/2003 Binnard et al. ........... 250/492.2

2001/0002303 A1    5/2001 Yuan
2005/0110970 A1 * 5/2005 Butler ......................... 355/53
2006/0119829 A1    6/2006 Cox et al.

OTHER PUBLICATIONS

European Search Report issued on Jun. 26, 2009 in European Application No. 07075633.3.

* cited by examiner

*Primary Examiner*—Diane I Lee
*Assistant Examiner*—Mesfin T Asfaw
(74) *Attorney, Agent, or Firm*—Pillsbury Winthrop Shaw Pittman LLP (57) ABSTRACT

A control system to control a position parameter of a stage in a lithographic apparatus includes a stage controller to control a position parameter of the stage in at least a first direction. The control system includes a disturbance torque estimator to estimate a disturbance torque on the stage, the disturbance torque about an axis extending in a second direction, the second direction being substantially perpendicular to the first direction. The control system includes a correction signal calculator, the correction signal calculator provided with the estimated disturbance torque and a signal representative of a position of the stage in a third direction, the third direction being substantially perpendicular to the first and second directions. The correction signal calculator determines a feedforward correction signal to correct a position error of the stage in the first direction due to the disturbance torque, the feedforward correction signal to be fed to the stage.

16 Claims, 4 Drawing Sheets

LITHOGRAPHIC APPARATUS AND DEVICE MANUFACTURING METHOD

BACKGROUND

1. Field of the Invention

The invention relates to a control system to control a position parameter of a stage in a lithographic apparatus, to a lithographic apparatus including such control system and to a device manufacturing method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus includes a substrate table to hold the substrate. The substrate table is positioned under control of a control system to be able to position a target portion of the substrate substantially in a focal plane of a projection system of the lithographic apparatus. The control system thus operates in a coordinate system which is related to a position of the projection system or the position of an image formed by the projection system on the substrate. A substrate table position measurement system may be configured to provide a position measurement of the substrate table with respect to an origin of such coordinate system. Typically, this origin is located directly under a lens center, at a substrate level. A position of the substrate table is controlled with a plurality of controllers, each functioning in one of the coordinates as measured by the measurement system. For example, controllers may be present operating in X, Y, Z, Rx, Ry, Rz coordinates, the latter three describing rotations around the X, Y and Z axes, respectively. Hence, each of these controllers generates a controller force or torque (i.e. a controller output signal to drive an actuator which actuator will thereby generate a force or torque) as a response to the deviation of the actually measured position in its coordinate system from the corresponding position set-point. The forces and torques calculated this way by the controllers, are also defined in the coordinate system as defined above, related to the lens center.

However, a position of a center of mass of the substrate table may not coincide with the origin of this coordinate system. In particular, the position of the center of mass of the substrate table shifts as the position of the substrate table changes with respect to the mentioned coordinate system. Now, when for example the Rx controller generates a torque to accelerate the substrate table around the X axis, depending on the shift of the substrate table center of mass with respect to the coordinate system origin in Y direction, a Z acceleration will result, in turn resulting in a Z position error. This is caused by the fact that a torque in Rx direction on the stage tilts the stage around a line crossing the center of mass of the stage, and not around the origin of the coordinate system under the lens, as would be desired. The resulting error in Z direction results in a response of the Z controller to bring it down to zero, however at this point the Z error has already occurred, which is undesirable.

To correct for this effect, a transformation matrix called gain scheduling matrix is used. This matrix transforms the forces and torques as generated by the controllers in the above-described lens-related coordinate system to forces and torques in the substrate table coordinate system, defined by the position of its center of mass. In the above example, when the Rx controller generates a torque to accelerate the substrate table around the X axis, depending on the position of the substrate table in Y direction, an extra force in Z will be generated that corrects for the error in Z that would occur otherwise, as described above. The gain scheduling matrix then generates an extra force in Z that makes sure the substrate remains in the focal plane of the lens, and hence the table actually tilts around the X axis as defined by the coordinate system described above related to the lens, instead of tilting around a line extending in X direction, crossing the center of mass of the stage. The generated extra force in Z is proportional to the controller-generated torque around the X axis, the distance of the stage center of mass with respect to the coordinate system origin in Y direction and the stage mass, and inversely proportional to the inertia of the stage around the X axis.

Similar techniques are applied for torques around the Y and Z axes, impacting X, Y and Z position errors. The gain scheduling matrix makes sure that the controller forces and torques in the above-mentioned lens-related coordinate system are translated to forces and torques in the center-of-mass related coordinate system of the substrate table. These forces and torques are then applied to the substrate table using actuators, that are naturally connected to a location which is fixed with respect to the substrate table's center of mass.

However, disturbance forces and disturbance torques act directly on the stage, as they naturally do not follow the gain scheduling compensation used for controller-generated forces and torques. As a result thereof, disturbance torques do have an influence on other directions. As an example, if the stage is positioned off-center, a disturbance torque which would tend to tilt the stage with respect to an axis extending along the plane of focus of the projection system and through the center of mass of the stage, would result in a vertical position error of the target portion under the lens center because of the tilting of the stage. In this context the term vertical should be understood as being a direction perpendicular to the plane of focus. As a result thereof, disturbance torques may result in focus errors hence resulting in a deterioration of an accuracy of the pattern to be projected on to the substrate. It is noted that if the torque would not be acting on the stage as a disturbance torque, but would have been generated by the controller as a signal to effectuate such a torque, the gain scheduling matrix would have added a force in the vertical direction to compensate for the above-mentioned effect of a displacement in vertical direction. Thus the gain scheduling matrix can effectively suppress the above effect when caused by a torque by the controller, however may not suppress this effect in case of a disturbance torque.

SUMMARY

It is desirable to provide an improved control system for a lithographic apparatus and a lithographic apparatus including such control system.

According to an embodiment of the invention, there is provided a control system to control a position parameter of a stage in a lithographic apparatus, the control system including, a stage controller to control a position parameter of the stage in at least a first direction, a disturbance torque estimator to estimate a disturbance torque on the stage, the disturbance torque about an axis extending in a second direction, the second direction being substantially perpendicular to the first direction, a correction signal calculator, the correction signal calculator being provided with the estimated disturbance torque and with a signal representative of a position of the stage in a third direction, the third direction being substantially perpendicular to the first and second directions, the correction signal calculator to determine a feedforward correction signal to correct a position error of the stage in the first direction due to the disturbance torque, the feedforward correction signal to be fed to the stage.

In another embodiment of the invention, there is provided a lithographic apparatus to transfer a pattern on to a substrate, the lithographic apparatus including a stage to hold the substrate and a control system according to the above embodiment of the invention, to control a position of the stage.

According to a further embodiment of the invention, there is provided a device manufacturing method, including irradiating a pattern on to a substrate by a lithographic apparatus according to an embodiment of the invention; developing the irradiated substrate; and manufacturing a device from the developed substrate.

In an embodiment of the invention, there is provided a lithographic apparatus including an illumination system configured to condition a beam of radiation; a patterning device support configured to support a patterning device, the patterning device configured to pattern the beam of radiation to form a patterned beam of radiation; a substrate support configured to support a substrate; a projection system configured to project the patterned beam of radiation onto the substrate, and a control system configured to control a position parameter of one of the supports, the control system including a stage controller configured to control a position parameter of the one of the supports in at least a first direction; a disturbance torque estimator configured to estimate a disturbance torque on the one of the supports about an axis extending in a second direction, the second direction being substantially perpendicular to the first direction; and a correction signal calculator, the correction signal calculator adapted to receive the estimated disturbance torque and a signal representative of a position of the one of the supports in a third direction, the third direction being substantially perpendicular to the first and second directions, the correction signal calculator configured to determine a feedforward correction signal to correct a position error of the one of the supports in the first direction due to the disturbance torque, the feedforward correction signal to be fed to the one of the supports.

In yet another embodiment of the invention, there is provided a device manufacturing method including conditioning a beam of radiation; patterning the beam of radiation to form a patterned beam of radiation with a patterning device, the patterning device supported by a patterning device support; projecting the patterned beam of radiation onto a substrate, the substrate supported by a substrate support; and controlling a position parameter of one of the supports with a control system, the control system including a stage controller configured to control a position parameter of the one of the supports in at least a first direction; a disturbance torque estimator configured to estimate a disturbance torque on the one of the supports about an axis extending in a second direction, the second direction being substantially perpendicular to the first direction; and a correction signal calculator, the correction signal calculator adapted to receive the estimated disturbance torque and a signal representative of a position of the one of the supports in a third direction, the third direction being substantially perpendicular to the first and second directions, the correction signal calculator configured to determine a feedforward correction signal to correct a position error of the one of the supports in the first direction due to the disturbance torque, the feedforward correction signal to be fed to the one of the supports.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
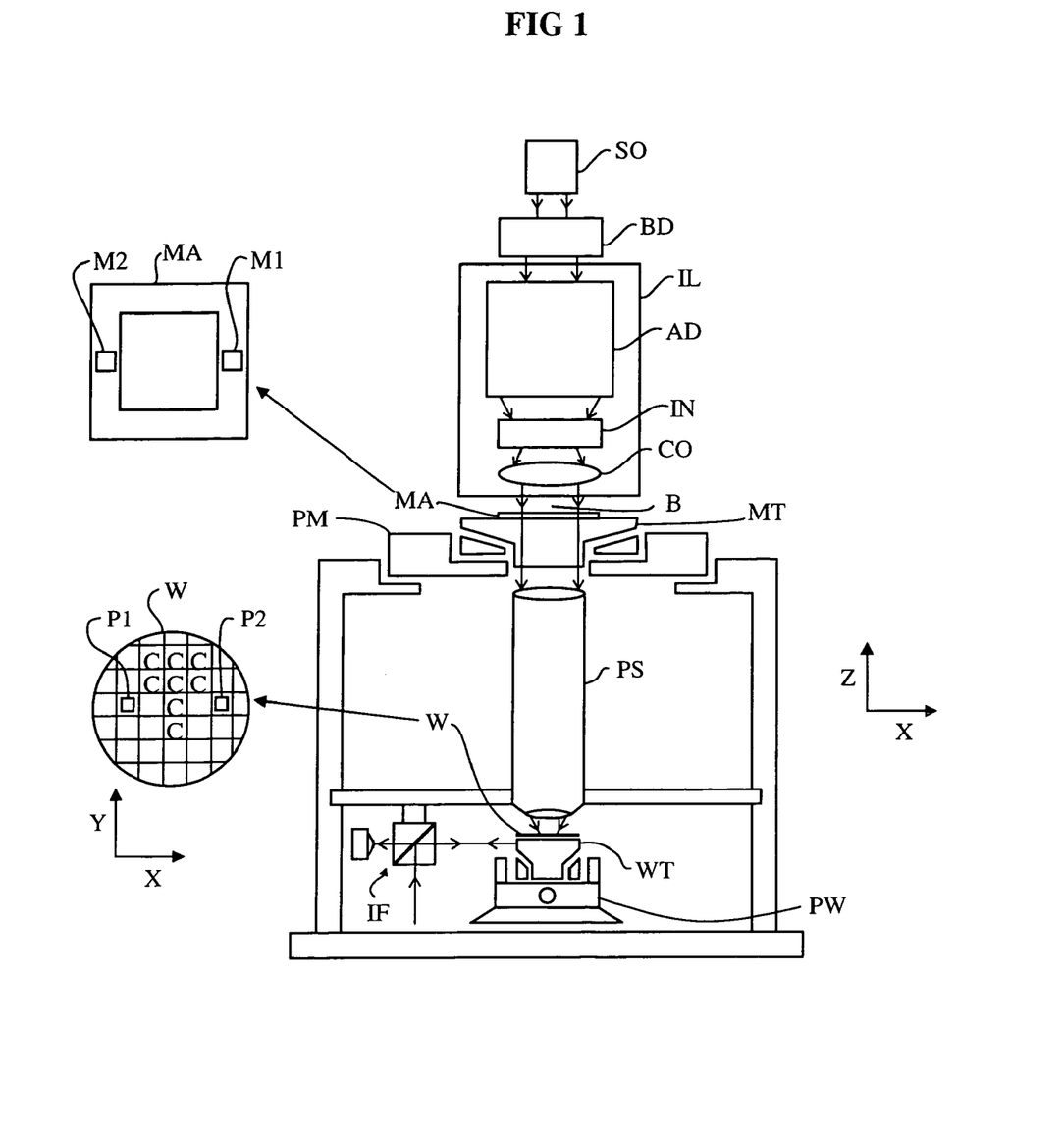
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at once (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
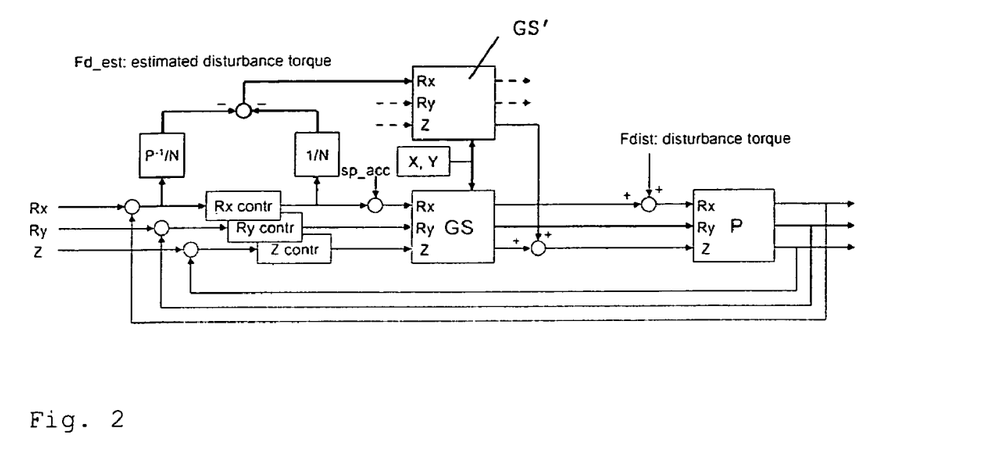
FIG. 2 depicts a control diagram of a controller according to an embodiment of the invention.

FIG. 2 depicts a control diagram of a control system to control a position of a stage P of the lithographic apparatus. The control system includes 3 closed loop control loops being an Rx, Ry and a Z control loop, thereby controlling rotations about an axis extending in X and Y direction, and a position in Z direction. It is noted that in the context of the document, the directions X and Y are to be understood as defining a plane which is substantially parallel to a plane of focus of the projection system, while the Z direction is substantially perpendicular thereto, the Z direction thus being substantially parallel to an optical axis of the projection system. Each of the control loops is provided with a set point Rx, Ry, Z, indicated at a left side of FIG. 2, a controller (Rx contr, Ry contr and Z contr) and a feedback path from an output of process P which in this example represents the stage and its actuators, to a subtraction point where the feedback signal is subtracted from the set point signal, an output thereof being provided to the respective controller. Furthermore, FIG. 2 depicts a gain-scheduling matrix GS which provides for an X, Y position dependent compensation of controller outputs (e.g. controller signals which represent a force). A reason for providing the gain scheduling has already been described above with reference to the state of the art. In an embodiment of the invention, the gain scheduling matrix which is included in the exemplary embodiment in the Rx, Ry and Z feedback loop, could be omitted. In that case, controller-generated torques are not fed through the gain scheduling matrix to avoid position errors, as described above. A disturbance torque estimator is provided to estimate a disturbance torque Fd_est, as indicated in FIG. 2. The estimated disturbance torque is in this example about an axis extending in X direction, thus an Rx disturbance torque. Such disturbance torque would result in a tilting of the stage about its center of mass, which would result in a position dependent focus error of the stage, as the tilting about the axis extending in the X direction will result in a Z displacement of the target portion if the center of mass of the substrate table is not positioned under the lens center. The further away the target portion of the substrate is from the center of mass of the stage, the larger an effect of the disturbance torque on the position in Z direction. When no further provisions would have been made, as in the state of the art, this position dependent error in Z direction would have been regulated away by the feedback loop for the Z direction, which will however take some time for the feedback loop to account for this disturbance.

According to an embodiment of the invention, a correction signal calculator is provided, indicated in FIG. 2 by GS', which is provided with the estimated disturbance torque and with a position of the stage in Y direction, and optionally also in X direction, as will be explained in more detail below. The correction signal calculator will determine a feedforward correction signal which is provided to a Z actuator input of stage P. It is noted that the control system as described here may also control a remainder of the 3 degrees of freedom of the stage, e.g. a position in X and Y direction and a rotation about an axis extending in Z direction, control loops for these degrees of freedom have however been omitted for clarity purposes. The control system according to an embodiment of the invention thus includes a stage controller (in this example the controller for the Z direction) to control a position parameter (in this example a position) of the stage in a first direction (in this example the Z direction), a disturbance torque estimator to estimate a disturbance torque Fd_est, the disturbance torque about an axis extending in a second direction (in this example the X direction), and a correction signal calculator GS' which is provided with the estimated disturbance torque and with a signal representative of a position of the stage in a third direction (in this example the Y direction), the correction signal calculator to determine a feedforward correction signal to correct a position error of the stage in the first direction, the position error being due to the disturbance torque Fdist, the feedforward correction signal to be forwardly fed to the stage (i.e. added to an output signal of the controller in Z direction (or in this example where also a gain scheduling matrix is provided, added to an output signal of the gain scheduling matrix), thus to a Z input of the stage P including its actuators.

In FIG. 2, a disturbance torque estimator and a correction signal calculator have been shown in relation to a disturbance torque about an axis extending in X direction. To be able to compensate for disturbance torques in X as well as Y direction, a second estimator may be provided which may be similar to the estimator depicted here, however connected to corresponding signals in the Ry control loop in stead of in the Rx control loop. The thus estimated disturbance torque about an axis extending in Y direction could then be provided to a corresponding Ry input of the correction signal calculator GS'. Similarly, a disturbance torque about an axis extending in the Z-direction can be estimated by a third estimator, and a corresponding X and/or Y position feedforward correction signal determined.

Figure 3:
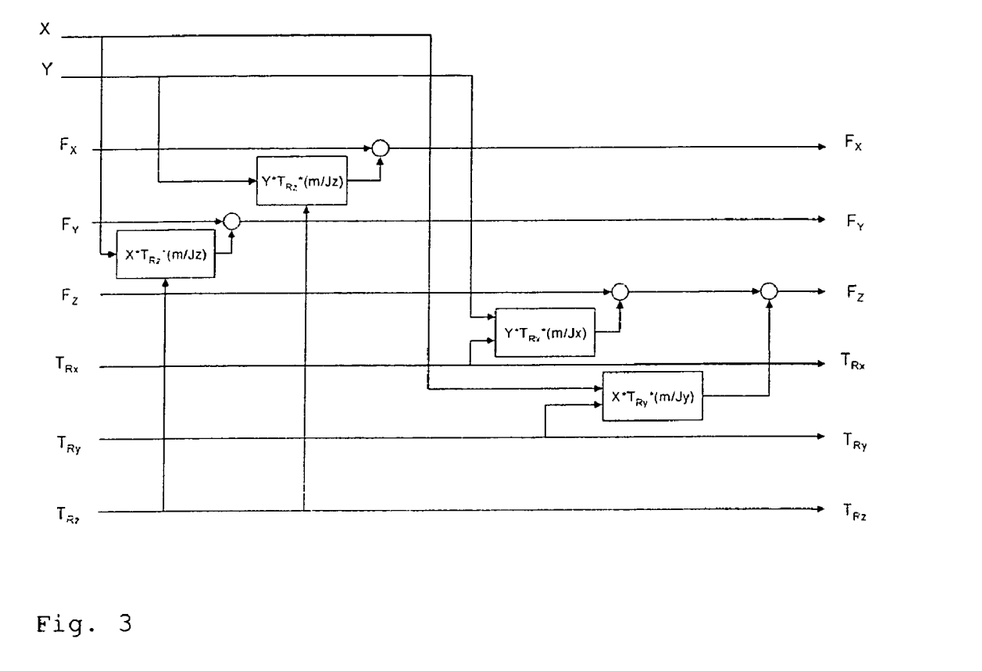
FIG. 3 depicts an example of the gain scheduling matrix of FIG. 2.

An embodiment of the correction signal calculator GS' is schematically depicted in FIG. 3. FIG. 3 depicts a plurality of inputs, including inputs for a position of the stage in X and Y direction, forces on the stage in X, Y and Z direction as indicated by $F_x$, $F_y$, $F_z$ and torques on the stage about an axis extending in X, Y respectively Z dimension, indicted by $T_{rx}$, $T_{ry}$ and $T_{rz}$ respectively. Further, the correction signal calculator includes corresponding outputs for the forces in X, Y and Z direction and the torque's about the X, Y and Z axis. In the example shown here, in fact four correction signals are calculated, each provided by a respective one of the blocks in the diagram. For the example shown in the FIG. 2 however, only a single one of the correction signals is used. In this example, use is made only of the correction signal which is determined by the torque about the axis extending in X direction, i.e. the estimated disturbance torque in FIG. 2, which is thus provided to input $T_{Rx}$ in FIG. 3. Also for the determination of the correction signal, use is made of the position in Y direction, and, as can be seen in FIG. 3, a correction signal in Z direction is determined which is added to the force $F_z$ in Z direction. The correction signal calculator thus determines the feedforward correction signal (in this example $F_z$) proportional to the estimated torque about the axis extending in the second direction (in this example Rx), proportional to the position in the third direction (here the position in Y direction) proportional to a mass of the stage, as indicated by m in the correction formula, and inversely proportional to an inertia of the stage, as indicated by Jx with respect to the second direction. Thus, thereby a correction is provided which by a simple calculation, provides for an adequate correction of the error in vertical direction due to a disturbance torque: the correction signal is in this embodiment linearly dependent on the torque and on the position of the stage in Y direction, as the higher the torque, the larger the focus error and the further the stage is away from its center position where a center of mass of the stage is in line with a optical axis of the projection system PS, the larger the error, and thus the larger the correction signal should be. Further, effects of the mass of the stage and the inertia of the stage are taken into account.

As has been described above, a second disturbance torque estimator could be added to determine a disturbance torque about an axis extending in Y direction. Such estimated disturbance torque could be provided to the input $T_{Ry}$ of the correction signal calculator which then, taking account of the position in X direction provided at corresponding input X, determines an additional correction signal added to the force in Z direction $F_z$ which is then provided to a corresponding input of the stage and actuators, indicated by P in FIG. 2. Thus, in this manner two correction signals are determined by the respective formulas which are then added to form a correction signal in Z direction. By taking into account of the positions in X and Y direction, it is provided that the correction depends on a distance between the lens center (i.e. the optical axis), which position is to be controlled, as the point of focus and the plane of focus are related thereto, and the stage position. It is thus assumed in the above that the positions X and Y represent a distance in the respective direction between the lens center and the stage position (in this example defined by the position of its center of mass).

The matrix depicted in FIG. 3 may not only be used as the correction signal calculator GS', however may also be applied as the gain-scheduling matrix GS. The correction signal calculator thereby includes a copy of the gain-scheduling matrix GS. However, the $F_x$, $F_y$ and $F_z$ inputs as well as the $T_{Rx}$, $T_{Ry}$, $T_{Rz}$ outputs of the correction signal calculator GS' may not be connected. On one hand, the use of a copy of the gain scheduling matrix provides for a relatively simple implementation, as the correction signal calculator may now form a duplicate of the gain scheduling matrix, while on the other hand a well behaving control system can be provided thereby as disturbance torques are in this way handled in a same way as torques provided by the respective controllers, such as controllers Rx and Ry. It is noted that in the gain scheduling matrix, further relations between the position and torque can be taken into account, for simplicity the dependency on the position in Z direction has been left out of the embodiment depicted in FIG. 3. Making use of the $T_{Rx}$, $T_{Ry}$, $T_{Rz}$ inputs as well as the $F_x$, $F_y$ and $F_z$ outputs of the correction signal calculator GS' (as well as the x and y position inputs), in total, 6 compensations could be included in the matrix where for each compensation a feedforward in a first direction is determined based on a disturbance torque about an axis extending in a second direction and a position of the stage in a third direction, the first, second and third direction being substantially perpendicular to each other. It is noted that a Z-position input may be omitted, as a movement of the substrate table takes place substantially in the X, Y plane only, however such input may easily be added to the exemplary embodiment of FIG. 3 by the skilled person.

In the embodiment shown in FIG. 2, the controller includes a feedback controller, however it will be understood by the skilled person that the principle of the disturbance torque estimator and the correction signal calculator, may be applied with any controller. In case of a feedback controller however, the disturbance torque may be estimated in a practical as well as accurate way. This is because the disturbance torque, indicated in FIG. 2 by Fdist will result in an error signal at an input of the Rx controller and at a corresponding change in an output of this controller to drive the stage P. In general, in a closed loop negative feedback system including controller C and process P, a disturbance torque $F_d$ will relate to an output Y of process P according to the below formula $$Y/F_d = P/(1+PC)$$

Assuming now that a set point input is 0, then an error signal e equals minus output signal Y, which allows to re-write the above expression into the following formula $$F_d = -P^{-1}e - Ce$$

Thus, the disturbance torque may be expressed as a function of the error signal which is present at the input of the respective controller and the error signal times the controller transfer function, which signal is present at the output of the respective controller. Such a function is depicted in FIG. 2, where a path from the error signal, i.e. the input of controller Rx to an adding device is provided, this path having a transfer function $P^{-1}/N$ as well as a path from the output of the Rx controller having a transfer function 1/N, to the adding device. At the adding device, the outputs of the two paths are added and multiplied by −1, to take account of the minus signs in the expression above, thereby providing the estimated disturbance torque. For practical reasons, a low pass filter is to be added to these expressions. This is because process transfer function P may have a finite bandwidth, thereby resulting in a differentiating function in $P^{-1}$ (which represents (an approximation of) an inverse of the process transfer function P). To avoid excessive magnitudes of signals in a physical (e.g. a numerical implementation), a low pass filter is to be added, which is represented in FIG. 2 by 1/N. Thereby an accurate approximation of the disturbance torque is provided for a frequency range below the range at which the low pass filter provides for an attenuation.

Note that other forms of disturbance torque estimators are possible. For example, one of the two branches may be omitted, also depending on the frequency range of the disturbance torques.

Figure 4A:
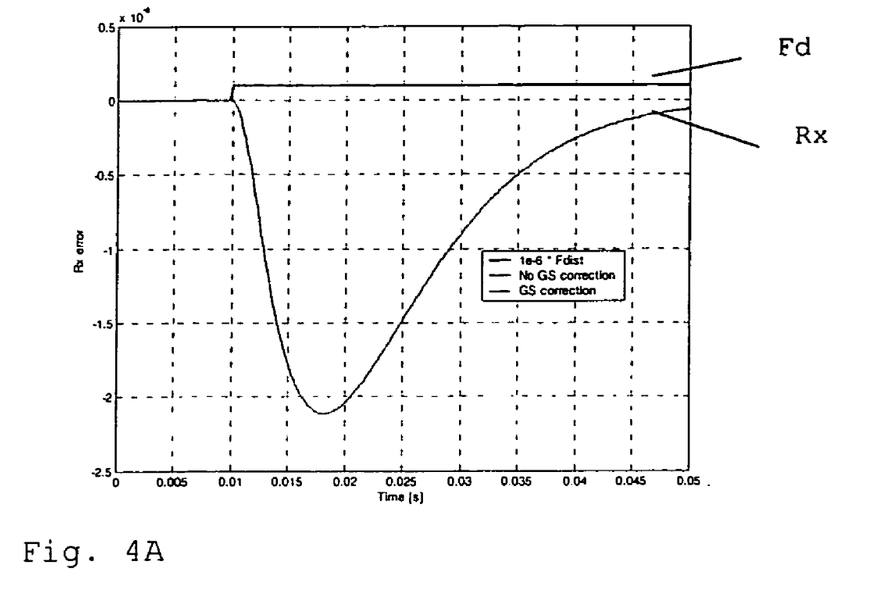
FIGS. 4 and 4b depict a time diagram of a response of a conventional control system in comparison with a control system according to an embodiment of the invention.
Figure 4B:
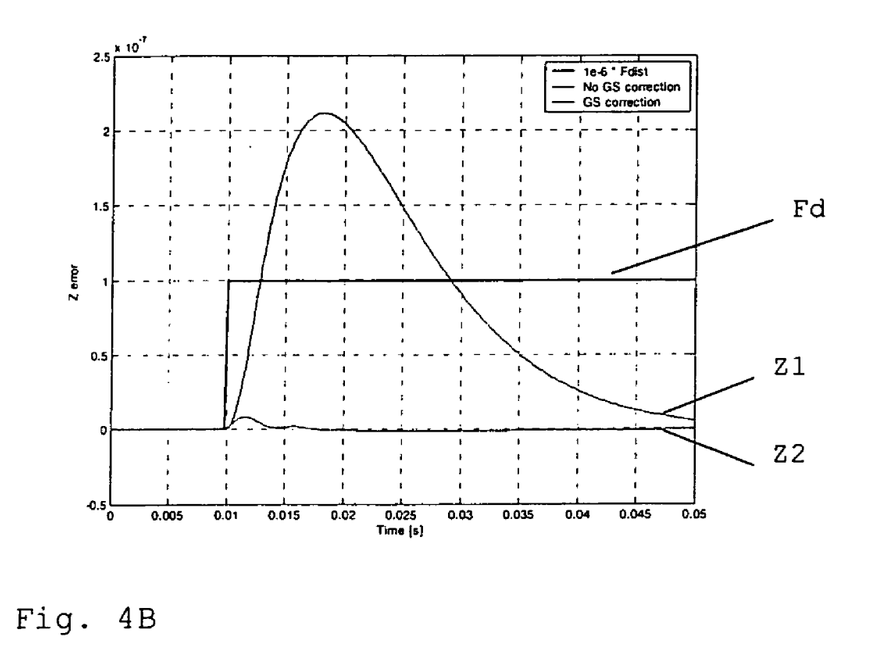
Figure 5:
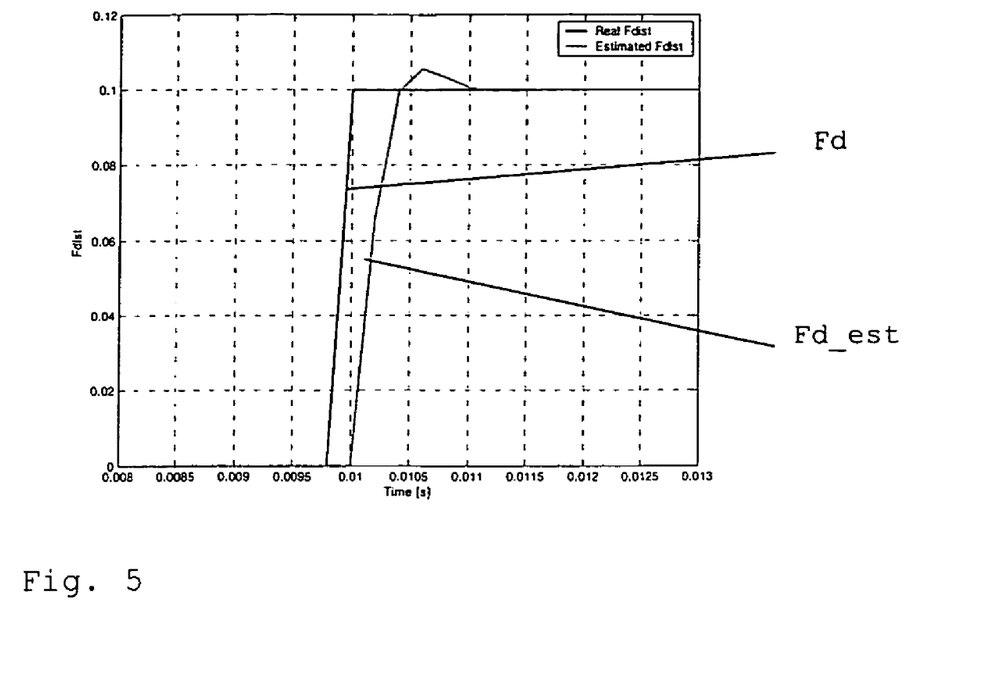
FIG. 5 depicts a time diagram of the disturbance torque a modeled and an estimation of the disturbance.

FIGS. 4a and 4b show a time diagram of a disturbance torque which shows a stepwise function, a response in Z direction thereto without the compensation as described above, indicated by $Z_1$) and a response including the correction described above (indicated by $Z_2$). The disturbance torque is applied at time T=0.01 seconds. Thereby, as depicted in FIG. 4a, an error of two microradians about an axis extending in X direction, results. As an effect thereof an error in Z direction, thus in a direction substantially perpendicular to the focal plane, results, indicated by Z1 in FIG. 4b. In the case without the disturbance torque estimation and feedforward signal calculation, this error is reduced by the feedback loop. In the curve $Z_2$, the effect is shown when the disturbance torque is estimated according to the above, and a correction signal is determined therewith. It can be seen that an effect of the error in Z direction decreases from approximately 200 nm to approximately 8 nm. Also, a time for regulating away a residual error, is thereby decreased. It is noted that the curve $Z_2$ shows a residual error due to a finite approximation of the disturbance torque. This finite approximation is due to the effect that low pass filters have been incorporated in the disturbance torque estimator, to make the disturbance torque estimator physically implementable. In this example, the filter cut off frequency has been set to 1000 Hz. This effect is also visible in FIG. 5, where a step function is shown which shows the disturbance torque Fd, while a slightly delayed estimated disturbance torque Fd_est is shown, which is delayed due to the effect of the low pass filters. Thus, the higher a cut off frequency of the low pass filters, the better an estimation of the disturbance torque, and thus the less residual error remains on the position in Z direction in relation to the optical axis and the point of focus of the projection system. However, in practice the bandwidth of the low-pass filter could be set lower, depending on the accuracy with which the implemented inverse process transfer, $P^{-1}$, matches the actual inverse process transfer function.

The controller disturbance torque estimator and corrections signal calculator may be implemented in any suitable form, i.e. in terms of suitable software instructions to be executed on a programmable device such as a microprocessor, micro controller, digital signal processor or any other data processing device and/or may fully or in part be implemented using suitable digital and/or analogue electronics. Other implementations, such as optical, mechanical, etc. are to be included in the scope of the invention also. Further, in the above description, a correction signal has been determined to correct an error in a Z direction, However, it is also possible that a correction signal for X and/or Y direction is determined mutatis mutandis.

The control system as described here can be used to control any position parameter, including a position, a velocity, an acceleration, etc. of the stage. Further, it is to be understood that the above example relates to a substrate stage, also indicated as substrate support, wafer table, etc, however the idea described here is applicable to control a position parameter of any stage, including but not limited to a substrate stage and a reticle stage (which is also indicated as a reticle support or patterning device support). With such a stage, the same or similar considerations apply as regarding the position of the substrate stage. This is because an accuracy of a projection of the pattern of the reticle on to the target portion of the substrate is not only related to a positioning of the target portion of the substrate with respect to the focal plane of the projection system but also to a position of the patterning device with respect to the projection system, as the projection system projects the pattern of the patterning device onto the target portion of the substrate. Thus, in this document, the term stage may be interpreted as a substrate stage, reticle stage, or any other stage or movable part in the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A control system configured to control a position parameter of a stage in a lithographic apparatus, the control system comprising:
    a stage controller configured to control a position parameter of the stage in at least a first direction;
    a disturbance torque estimator configured to estimate a disturbance torque on the stage about an axis extending in a second direction, the second direction being substantially perpendicular to the first direction; and
    a correction signal calculator, the correction signal calculator adapted to receive the estimated disturbance torque and a signal representative of a position of the stage in a third direction, the third direction being substantially perpendicular to the first and second directions, the correction signal calculator configured to determine a feedforward correction signal to correct a position error of the stage in the first direction due to the disturbance torque using the estimated disturbance torque and the signal representative of the position of the stage in the third direction, the feedforward correction signal to be fed to the stage.

2. The control system according to claim 1, wherein the disturbance torque estimator is configured to further estimate a disturbance torque about an axis extending in the third direction, wherein the correction signal calculator is configured to (a) receive the estimated disturbance torque about the third direction and a signal representative of a position of the stage in the second direction and (b) determine the feedforward correction signal in response to the estimated disturbance torques about the second and third directions and the position of the stage in the second and third directions.

3. The control system according to claim 1, wherein the correction signal calculator is arranged to determine the feedforward correction signal proportional to (a) the estimated torque about the axis extending in the second direction, (b) the position in the third direction and (c) a mass of the stage, and inversely proportional to an inertia of the stage with respect to the second direction.

4. The control system according to claim 1, wherein the stage controller comprises a gain scheduling matrix, and wherein the correction signal calculator comprises a copy of the gain scheduling matrix.

5. The control system according to claim 1, wherein the stage controller comprises a feedback controller to form a closed loop control.

6. The control system according to claim 5, wherein the disturbance torque estimator comprises
a first path that extends from an error signal input of a controller to control a rotation of the stage about an axis extending in a respective direction to an adding device, the first path comprising an approximation of an inverse process transfer function of the stage, and
a second path from a controller output signal of the controller to control the rotation about the axis extending in the respective direction, to the adding device, an output signal of the adding device to provide the estimated disturbance torque.

7. The control system according to claim 6, wherein the first and second path each comprise a low pass filter.

8. The control system according to claim 1, wherein the stage is configured to move under control of the control system with respect to an irradiation system focal plane, the first direction being substantially perpendicular to the focal plane, the correction signal calculator being provided with a position in the second and/or third direction representing a distance in the respective direction between a center of mass of the stage and a focus point of the focal plane.

9. A lithographic apparatus to transfer a pattern onto a substrate, the lithographic apparatus comprising a stage to hold the substrate and a control system according to claim 1 to control a position of the stage.

10. A device manufacturing method comprising:
irradiating a pattern onto a substrate by a lithographic apparatus according to claim 9;
developing the irradiated substrate; and
manufacturing a device from the developed substrate.

11. A lithographic apparatus comprising:
an illumination system configured to condition a beam of radiation;
a patterning device support configured to support a patterning device, the patterning device configured to pattern the beam of radiation to form a patterned beam of radiation;
a substrate support configured to support a substrate;
a projection system configured to project the patterned beam of radiation onto the substrate, and
a control system configured to control a position parameter of one of the supports, the control system including
a stage controller configured to control a position parameter of the one of the supports in at least a first direction;
a disturbance torque estimator configured to estimate a disturbance torque on the one of the supports about an axis extending in a second direction, the second direction being substantially perpendicular to the first direction; and
a correction signal calculator, the correction signal calculator adapted to receive the estimated disturbance torque and a signal representative of a position of the one of the supports in a third direction, the third direction being substantially perpendicular to the first and second directions, the correction, signal calculator configured to determine a feedforward correction signal to correct a position error of the one of the supports in the first direction due to the disturbance torque using the estimated disturbance torque and the signal representative of the position of the one of the supports in the third direction, the feedforward correction signal to be fed to the one of the supports.

12. The lithographic apparatus according to claim 11, further comprising another control system configured to control a position parameter of the other one of the supports, the other control system including
a stage controller configured to control a position parameter of the other one of the supports in at least the first direction;
a disturbance torque estimator configured to estimate a disturbance torque on the other one of the supports about the second direction; and
a correction signal calculator, the correction signal calculator adapted to receive the estimated disturbance torque and a signal representative of a position of the other one of the supports in the third direction, the correction signal calculator configured to determine a feedforward correction signal to correct a position error of the other one of the supports in the first direction due to the disturbance torque, the feedforward correction signal to be fed to the other one of the supports.

13. The lithographic apparatus according to claim 11, wherein the disturbance torque estimator is configured to further estimate a disturbance torque about an axis extending in the third direction, wherein the correction signal calculator is configured to (a) receive the estimated disturbance torque about the third direction and a signal representative of a position of the one of the supports in the second direction and (b) determine the feedforward correction signal in response to the estimated disturbance torques about the second and third directions and the position of the one of the supports in the second and third directions.

14. The lithographic apparatus according to claim 11, wherein the correction signal calculator is arranged to determine the feedforward correction signal proportional to (a) the estimated torque about the axis extending in the second direction, (b) the position in the third direction and (c) a mass of the one of the supports, and inversely proportional to an inertia of the one of the supports with respect to the second direction.

15. The lithographic apparatus according to claim 11, wherein the stage controller comprises a gain scheduling matrix, and wherein the correction signal calculator comprises a copy of the gain scheduling matrix.

16. A device manufacturing method comprising:
conditioning a beam of radiation;
patterning the beam of radiation to form a patterned beam of radiation with a patterning device, the patterning device supported by a patterning device support;

projecting the patterned beam of radiation onto a substrate, the substrate supported by a substrate support; and controlling a position parameter of one of the supports with a control system, the control system including a stage controller configured to control a position parameter of the one of the supports in at least a first direction;

a disturbance torque estimator configured to estimate a disturbance torque on the one of the supports about an axis extending in a second direction, the second direction being substantially perpendicular to the first direction; and a correction signal calculator, the correction signal calculator adapted to receive the estimated disturbance torque and a signal representative of a position of the one of the supports in a third direction, the third direction being substantially perpendicular to the first and second directions, the correction signal calculator configured to determine a feedforward correction signal to correct a position error of the one of the supports in the first direction due to the disturbance torque using the estimated disturbance torque and the signal representative of the position of the one of the supports in the third direction, the feedforward correction signal to be fed to the one of the supports.

* * * * *